United States Patent
Fender et al.

(10) Patent No.: US 10,816,895 B2
(45) Date of Patent: Oct. 27, 2020

(54) PHOTOMASK CLEANING PROCESSES

(71) Applicant: Applied Materials, Inc., Santa Clara, CA (US)

(72) Inventors: Bruce Fender, Kalispell, MT (US); Jerry D. Leonhard, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/126,046

(22) Filed: Sep. 10, 2018

(65) Prior Publication Data

US 2019/0079388 A1 Mar. 14, 2019

Related U.S. Application Data

(60) Provisional application No. 62/556,736, filed on Sep. 11, 2017.

(51) Int. Cl.
*G03F 1/82* (2012.01)
*G03F 1/22* (2012.01)
*G03F 1/64* (2012.01)

(52) U.S. Cl.
CPC ............... *G03F 1/82* (2013.01); *G03F 1/22* (2013.01); *G03F 1/64* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,071,376 A * | 6/2000 | Nagamura | ............. | G03F 1/82 156/345.22 |
| 2007/0068558 A1 * | 3/2007 | Papanu | ............. | G03F 1/82 134/29 |
| 2007/0113866 A1 * | 5/2007 | Chovino | ............. | G03F 1/82 134/1 |
| 2011/0023914 A1 | 2/2011 | Jeong et al. | | |
| 2011/0146727 A1 * | 6/2011 | Kalyankar | ............. | B08B 3/10 134/28 |
| 2014/0273499 A1 | 9/2014 | Huang et al. | | |
| 2015/0107617 A1 | 4/2015 | Lee et al. | | |
| 2017/0110355 A1 | 4/2017 | Numanami et al. | | |

FOREIGN PATENT DOCUMENTS

JP 2013068786 4/2013

OTHER PUBLICATIONS

PCT/US2018/050152 , "International Search Report and Written Opinion", dated Jan. 2, 2019, 9 pages.
International Preliminary Report on Patentability dated Mar. 26, 2020 in related foreign application No. PCT/US2018/050152, all pgs.

* cited by examiner

*Primary Examiner* — Erin F Bergner
(74) *Attorney, Agent, or Firm* — Kilpatrick Townsend & Stockton LLP

(57) ABSTRACT

Methods of cleaning a photomask may include heating residual coupling material on a surface of the photomask. The photomask may be characterized by active regions and edge regions. The residual coupling material may be located on portions of the edge regions of the photomask. The methods may include applying an etchant to the residual coupling material. The methods may also include rinsing the etchant from the photomask. A portion of the active regions of the photomask may be maintained substantially free of the etchant during the method.

19 Claims, 3 Drawing Sheets

PHOTOMASK CLEANING PROCESSES

CROSS-REFERENCE TO RELATED APPLICATIONS

This application claims the benefit of U.S. Provisional Application No. 62/556,736, filed Sep. 11, 2017, which is hereby incorporated by reference in its entirety for all purposes.

TECHNICAL FIELD

The present technology relates to cleaning photomasks. More specifically, the present technology relates to removing residual coupling material from a surface of a photomask.

BACKGROUND

Semiconductor devices are generally formed by producing intricate structures on a substrate or workpiece. Fabrication often includes patterning a substrate with a lithography process. Developing lithographic techniques include extreme ultraviolet lithography ("EUV") in which a mask pattern is reflected onto photoresist on a semiconductor substrate. The EUV mask may be connected with a scanner, and then an optical system may reflect the light from the mask onto the wafer. The EUV process may require additional hardware such as a pellicle, which may be directly or indirectly coupled to the photomask.

SUMMARY

Systems and methods of cleaning a photomask may include heating residual coupling material on a surface of the photomask. The photomask may be characterized by active regions and edge regions. The residual coupling material may be located on portions of the edge regions of the photomask. The methods may include applying an etchant to the residual coupling material. The methods may also include rinsing the etchant from the photomask. A portion of the active regions of the photomask may be maintained substantially free of the etchant during the method.

In some embodiments, the heating may raise a temperature of the residual coupling material above about 200° C., while maintaining the photomask at a temperature below about 150° C. The heating may include localized heating applied proximate the residual coupling material. The heating may be contained within a region of the photomask characterized by a diameter less than 500% greater than a diameter of the residual coupling material. The heating may be performed for less than or about 5 minutes. The etchant may include sulfuric acid and hydrogen peroxide. Applying the etchant may include sequentially applying the sulfuric acid and the hydrogen peroxide. The sulfuric acid may be applied prior to the hydrogen peroxide, and the hydrogen peroxide may be applied to the sulfuric acid after a delay of at least about 2 seconds. The etchant may include less than about 5 mL each of the sulfuric acid and the hydrogen peroxide. The rinsing may include delivering deionized water to the photomask to remove the etchant. The deionized water may be applied to a central location on the photomask and caused to flow laterally outward towards the etchant, which may limit etchant contact in active regions of the photomask. The photomask may be rotated during the rinsing.

Embodiments of the present technology may further encompass methods of cleaning a photomask. The methods may include heating coupling material on a surface of a photomask. The photomask may be characterized by active regions and edge regions. The residual coupling material may be located on portions of the edge regions of the photomask. The methods may also include delivering a liquid etchant to the residual coupling material. The delivery may be contained within a surface area of the photomask less than about 10 $cm^2$ in which the heated residual coupling material resides. The methods may include rinsing the etchant from the photomask. A portion of the active regions of the photomask may be maintained substantially free of the etchant during the delivery of the liquid etchant and rinsing operations. The methods may also include drying the photomask.

In some embodiments, the method may be performed in less than or about 20 minutes. The drying may be performed in a controlled environment. Delivering the liquid etchant may include sequentially applying sulfuric acid and hydrogen peroxide to the heated coupling material. The heating may be performed by a heat lamp for a time period less than or about 2 minutes. The rinsing may include delivering a rinsing agent to the photomask radially inward of a location on the photomask on which the etchant is located. The rinsing may be performed less than 5 minutes subsequent delivering the liquid etchant.

Embodiments of the present technology may further encompass methods of cleaning a photomask. The methods may include heating coupling material to a temperature above about 300° C. at a first location on a surface of a photomask. The photomask may include active regions and edge regions, and the residual coupling material may be located on portions of the edge regions of the photomask. The methods may include delivering a two-part liquid etchant to the residual coupling material. The delivery may include initially providing a volume of sulfuric acid and subsequently providing a volume of hydrogen peroxide. The methods may include rotating the photomask while applying a rinsing agent to the photomask. The rinsing agent may be delivered to a central location on the photomask. The methods may also include drying the photomask. In some embodiments, the method may be repeated at a second location on a surface of the photomask on which additional coupling material may be located.

Such technology may provide numerous benefits over conventional technology. For example, the present methods may improve mask integrity by limiting etchant contact over active regions of the mask. Additionally, the improved methodology may reduce queue times by performing a number of targeted removals instead of a bath process. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

EUV lithography processes sometimes use a pellicle to limit exposure of the photomask to particles, which may cause defects during processing. The pellicle is typically a membrane that is connected to the photomask and operates as a dust cover as well as an optical mask that may dissipate heat from the scanning process. The mask pattern may then be reflected through an optics system onto a wafer to be processed. The photomask typically includes active regions with defined patterns to be transferred to a wafer as well as edge regions of the photomask outside of the active regions, such as a window frame extending about the photomask active regions, which may only include non-active areas.

Figure 1:
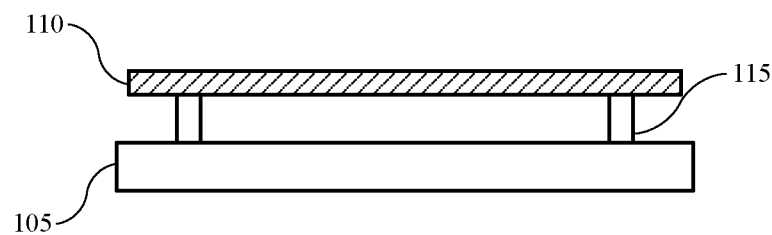
FIG. 1 shows a schematic elevational view of an exemplary photomask according to some embodiments of the present technology.

The pellicle may be attached to the photomask with standoffs allowing the pellicle to sit above the mask for exposure. FIG. 1 includes a schematic cross-sectional view of an exemplary photomask 105 according to some embodiments of the present technology. Photomask 105 may be any known photomask materials or transparencies produced from a number of materials and metals. As illustrated, a pellicle 110 has been attached to photomask 105 with a set of standoffs 115. The standoffs may be metal or non-metal components of a variety of shapes and sizes. To provide perspective only, and not with any intention of limiting the present technology, standoffs 115 may be characterized by a diameter of less than or about 10 mm, and may be characterized by a diameter of less than or about 5 mm, less than or about 3 mm, less than or about 1 mm, or less. By diameter is meant only a linear distance across the standoff, and is not meant to suggest a necessarily curved shape of the standoff.

Any number of standoffs 115 may be disposed about the photomask, and may include 2, 3, 4, 5, 6, or more depending on the size of the photomask, for example. The standoffs may be adhered to the photomask 105 with a glue or adhesive material, or more generally some type of coupling material that may include bonding. The adhesive may include any known adhesives, and in embodiments may include polymeric adhesives including epoxy, acrylic, or polymeric adhesives such as polyurethanes or any other polymers that may be useful as an adhesive.

Figure 2:
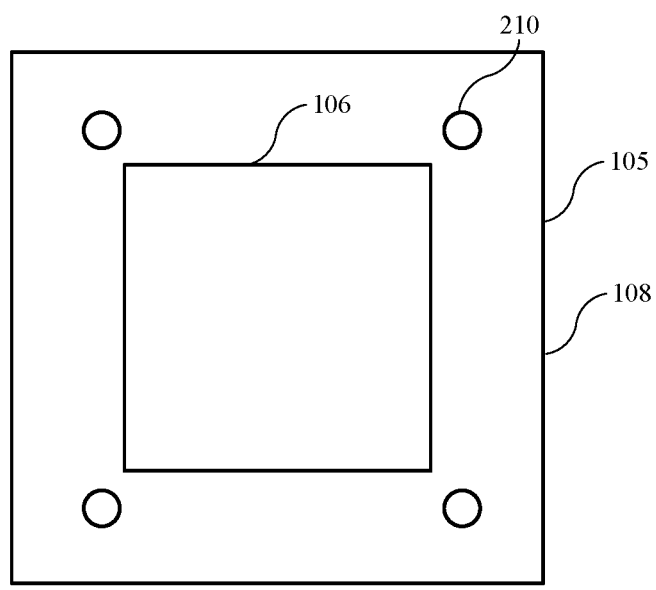
FIG. 2 shows a schematic plan view of an exemplary photomask according to some embodiments of the present technology.

After processing, the pellicle may be removed from the standoffs, and the standoffs may be removed from the photomask by heating the photomask and pulling the standoffs, or any other method for removal. Once removed, an amount of the coupling material may remain on the photomask. Turning to FIG. 2 is shown a schematic plan view of an exemplary photomask 105 according to some embodiments of the present technology. As illustrated, pellicle 110 and standoffs 115 have been removed. The photomask may have a central active region 106 as well as an exterior edge region 108. The illustrated regions are for explanation only and are not intended to limit the present technology. It is to be understood that the active and edge regions of the photomask may be of any particular geometry or size, and the residual coupling material may be located at any position about the photomask edge regions. Exemplary photomask 105 illustrates four standoffs being removed, although as previously noted, any number of standoffs may have been used to attach and secure the pellicle to the photomask. Residual coupling material 210 may remain at any location where a standoff had been attached to the photomask, and may be limited to areas or locations within edge regions 108. The residual coupling material may be characterized by diameters of less than a centimeter or less in some embodiments, but may include residual coupling material at multiple locations across the photomask as illustrated in the figure.

Due to the durability and composition of the adhesives used for standoff attachment, removal of the residual coupling material may be difficult. Conventional technologies may have addressed this residual material by submerging the photomask 105 in a bath. The bath may have included a heated etchant formula configured to remove the residual adhesive. Because the entire photomask may be submerged in the bath, the entire photomask may be exposed to the etchant. The etchant may be heated to temperatures that may have exceeded 100° C., although temperatures may have been limited by characteristics of the photomask. Because temperatures of the removal may be limited from around 120° C. to about 140° C., the removal process may require submersion in the etchant bath for time periods greater than an hour to an hour and a half or more.

The temperature of the bath and the etchant formula may affect a variety of aspects of the mask. For example, mask integrity may be compromised due to the elevated temperatures. When maintained at the bath temperatures for an extended period of time, such as over 30 minutes or more, the mask may also become distorted. Due to the length of time of submersion, the etchant may affect critical dimensions of the mask through over etching. Additionally, the etchant may cause phase shift and reflectance change of the mask, which can reduce image quality. Finally, residual ions from the etchant may remain in the mask structure subsequent the coupling material removal.

The present technology may overcome these issues by providing a limited chemical delivery to the regions at which the adhesive material remains on the photomask. By performing localized heating and etching of the residual coupling material, higher temperatures and improved etchant formulas may be utilized, which may reduce, limit, or prevent exposure of the active regions of the photomask from being exposed to etchant materials. This may increase mask integrity and quality over conventional methods.

Figure 3:
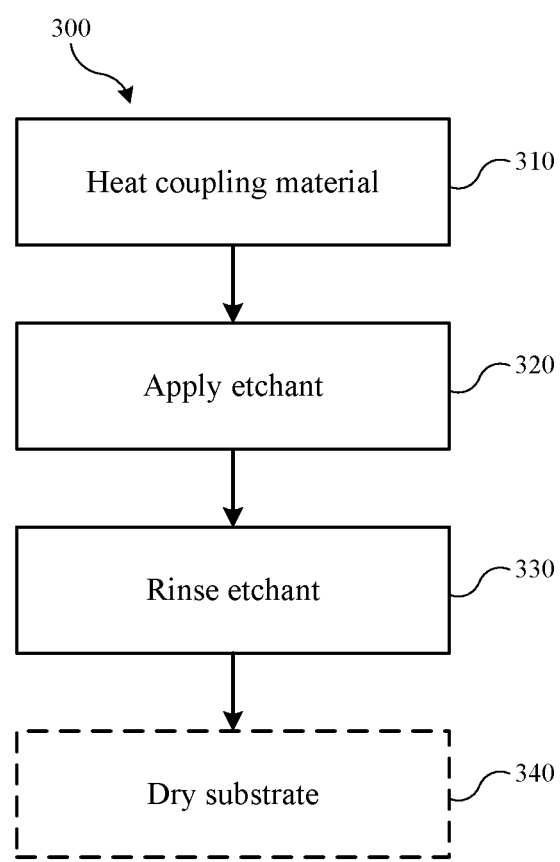
FIG. 3 shows exemplary operations of a method of cleaning a photomask according to some embodiments of the present technology.

FIG. 3 shows exemplary operations of a method 300 of cleaning a photomask according to some embodiments of the present technology. The photomask may include active regions and edge or non-active regions. A residual coupling material may remain over one or more locations of the photomask along edge regions of the photomask. The method 300 may include heating the residual coupling material on the surface of the photomask at operation 310. Once heated, method 300 may include applying an etchant to the residual coupling material at operation 320, which may remove the residual coupling material from the surface of the photomask. At operation 330, the etchant may be rinsed from the surface of the photomask. Method 300 may include drying the photomask at optional operation 340 prior to subsequent processing of the photomask. By performing operations according to method 300, in some embodiments a portion of the active regions of the photomask may be maintained substantially free of the etchant during performance of the method.

The heating operation of method 300 may be performed by a focused heating proximate the residual material. For example, laser heating, a heat lamp, or radiative heating may be performed adjacent the residual coupling material. This heating may increase the temperature of the residual coupling material to greater than or about 100° C., and in embodiments may increase the temperature of the residual coupling material to greater than or about 150° C., greater than or about 200° C., greater than or about 250° C., greater than or about 300° C., greater than or about 350° C., greater than or about 400° C., greater than or about 450° C., greater than or about 500° C., or more. As previously discussed, photomask materials may begin to deform at temperatures greater than or about 120° C. depending on the time at which they are exposed to the elevated temperatures. This is in part why etchant baths are maintained in this temperature range. By utilizing a focused heat lamp, however, the present technology may utilize higher temperatures for shorter periods of time.

The external heating may increase a temperature of the residual coupling material to several hundred degrees, while a surface of the photomask may not exceed 250° C., and in some embodiments may not exceed temperatures above or about 200° C., above or about 180° C., above or about 160° C., above or about 140° C., or less. Moreover, the temperature within the bulk of the photomask, and outside of a controlled area of heating, may be maintained substantially below 120° C. This may in part be due to the time of heat exposure. By utilizing heating devices as noted above, the heating time may be less than or about 10 minutes, and may be performed for less than or about 8 minutes, less than or about 6 minutes, less than or about 5 minutes, less than or about 4 minutes, less than or about 3 minutes, less than or about 2 minutes, less than or about 1.5 minutes, less than or about 1 minute, or less. Additionally, the area of exposure to heat may be limited to an area encompassing the residual coupling material.

As previously noted, the residual coupling material may be limited to an area of a few square millimeters or less in some embodiments, although in other embodiments the area may be greater depending on the size of the standoffs. The residual coupling material may also be substantially or completely located within edge regions of the photomask. The localized heating may be generally centered about the residual coupling material, and a cone or area of heating may be limited to the area of the residual coupling material and a contained area surrounding this area or proximate the residual coupling material. For example, the contained area of exposure may include a region of the photomask characterized by a diameter less than or about 500% greater than the diameter of the residual coupling material. Additionally, the diameter may be less than or about 400% greater than the diameter of the residual coupling material, and may be less than or about 300% greater, less than or about 200% greater, less than or about 100% greater, less than or about 50% greater, or may be substantially similar to the diameter occupied by the residual coupling material depending on a configuration and exposure radius of the heating device.

This corresponding area may depend on the size of the photomask, the size of the standoffs, and the area occupied by the residual coupling material. However, in some embodiments the area of exposure may be less than or about 10 $cm^2$, and in embodiments may be less than or about 8 $cm^2$, less than or about 6 $cm^2$, less than or about 5 $cm^2$, less than or about 4 $cm^2$, less than or about 3 $cm^2$, less than or about 2 $cm^2$, less than or about 1 $cm^2$, or less. In some embodiments, the entire area exposed to heating may be maintained in edge regions or non-device regions of the photomask. In this way, the active regions of the photomask may not be heated, or may have limited heating occur, which may be below a threshold for deformation or damage to the photomask.

The etchant used in the present technology may depend on the material used for the coupling material. Depending on the adhesive, any number of acid-based etchants may be used including any halogen-containing etchant, sulfur-containing etchant, phosphorous-containing etchant, carbon-containing etchant, boron-containing etchant, or other etchant or combination of etchants that may be used to react with or remove the residual coupling material. In some embodiments, the etchant may include a multi-component etchant configured to remove residual coupling material. An exemplary multi-component etchant may be piranha solution, which may include an amount of sulfuric acid and an amount of hydrogen peroxide, although other piranha solutions including other materials such as ammonium hydroxide may be used in some embodiments.

The etchant may be administered to the heated coupling material in any number of ways, and may include a targeted delivery to the site of the coupling material. For example, an amount of etchant, which may be a liquid etchant in embodiments, may be directly applied to the heated residual coupling materials in embodiments. Such an application may limit exposure of other areas of the photomask to the etchant material. When multi-component etchants are utilized, such as combinations of sulfuric acid and hydrogen peroxide, for example, the etchant components may be applied sequentially, or in a pre-mixed combination form.

In some embodiments the components may be provided sequentially to enhance the operations performed. For example, in some embodiments sulfuric acid may be delivered to the heated residual coupling material followed by delivery of the hydrogen peroxide. In other embodiments the materials may be delivered reversed, the components may be delivered at the same time, or a pre-mixed solution may be delivered. As noted, in some embodiments sulfuric acid may be administered prior to hydrogen peroxide, which may be delivered subsequently, and may include being delivered after a delay. The sulfuric acid may initially dehydrate the residual coupling material to leave a carbon residue. Subsequent delivery of hydrogen peroxide may transiently produce atomic oxygen, which may readily remove the carbon residue. Accordingly, in some embodiments, the hydrogen peroxide may be delivered to the residual coupling material about 0.5 seconds or more after delivery of the sulfuric acid, and in some embodiments the hydrogen peroxide may be delivered greater than or about 1 second after delivery of the sulfuric acid, greater than or about 2 seconds after, greater than or about 3 seconds after, greater than or about 4 seconds after, greater than or about 5 seconds after, or more. By administering the components sequentially, the sulfuric acid may further dehydrate the adhesive causing a more easily removed carbon-based backbone to remain. Additionally, the sequential administration may limit the self-decomposition of hydrogen peroxide that may occur in premixed solutions when not readily utilized.

Subsequent delivery, the etchant may be maintained on the photomask for a time period sufficient to dissolve or otherwise remove the residual coupling material from the surface of the photomask. For example, the etchant may or may not be agitated while sitting on the photomask, and may remain on the photomask for less than or about 5 minutes, depending on the amount of residual coupling material to be removed. In some embodiments, the etchant may be maintained on the photomask for less than or about 4 minutes, less than or about 3 minutes, less than or about 2 minutes, less than or about 1 minutes, less than or about 45 seconds, less than or about 30 seconds, less than or about 15 seconds, or less. Because the residual coupling material may be heated to several hundred degrees, the time to remove all residual material may be much less than in conventional technologies where the photomask may be maintained in a bath for well over an hour.

By performing a targeted delivery of the etchant materials, less etchant may be used in some embodiments of the present technology. For example, the present technology may use less than or about 10 mL of each of the etchant components. In some embodiments the present technology may use less than or about 5 mL, less than or about 4 mL, less than or about 3 mL, less than or about 2 mL, less than or about 1 mL, less than or about 0.8 mL, less than or about 0.6 mL, less than or about 0.5 mL, less than or about 0.4 mL, less than or about 0.3 mL, less than or about 0.2 mL, less than or about 0.1 mL, or less depending on the amount of residual coupling material to be removed. Again, this may limit the photomask exposure to etchant at any of the areas listed above, which may be equal to, greater than, or less than the area of heating. Thus, in some embodiments, only edge regions or portions of edge regions of the photomask may be exposed to etchant solution, and active regions of the photomask may not be exposed to the etchant, or may have limited exposure.

The rinsing operation may include any neutralizing agent for the etchant, or may simply remove the etchant from the photomask. For example, in some embodiments deionized water may be delivered to the photomask to rinse the etchant from the surface of the photomask. The volume of deionized water may not be significant, and may be sufficient to flood the surface of the photomask to ensure complete removal of the etchant. The way in which the deionized water is delivered, however, may further ensure that active regions of the photomask may not be exposed to etchant. For example, if the photomask were hypothetically tilted to drain off the etchant, the etchant could run across the photomask through central regions where the active regions may be located and interact with the active regions. Similarly, depending on the rinsing operation performed, the etchant—even in a diluted form, may contact other regions of the photomask potentially causing any of the above-described issues or damage to the active regions of the photomask.

Accordingly, in some embodiments the rinsing agent may be delivered to the photomask at or near a central location of the photomask. The rinsing agent may then flow or be caused to flow radially or laterally outward towards the etchant to express the etchant solution further into the edge regions of the photomask before delivering the etchant off the photomask completely. In some embodiments the photomask may be rotated or spun during delivery of the rinsing agent to facilitate outward flow from inertial forces. This may also drive the etchant off the photomask and away from regions of the photomask where active regions of the photomask are located. After the rinsing agent has been flowed to remove the etchant from the surface of the photomask, the photomask may be dried by further spinning the photomask without delivery of additional rinsing agent, or by maintaining the photomask in an environment suitable to dry the photomask. For example, in some embodiments the photomask may be maintained in a controlled environment that may include a heated environment, an inert environment, such as a nitrogen environment, and may include a filtered environment including a HEPA or ULPA-filtered environment.

Depending on the time to dry the photomask, the process of removing residual coupling material through drying the photomask may take less than or about 20 minutes. In some embodiments, the process may be performed in less than or about 15 minutes, less than or about 10 minutes, less than or about 9 minutes, less than or about 8 minutes, less than or about 7 minutes, less than or about 6 minutes, less than or about 5 minutes, or less. The process may then be repeated in a separate location on the photomask such as at a second location at which a standoff has been removed and residual coupling material remains on the photomask at an additional edge region location. Depending on the mechanical setup, each location may be removed sequentially, or may be removed simultaneously, such as with multiple lamps and delivery systems, as well as with overlapping operations. When performed sequentially, a photomask having four locations of residual coupling material may be processed to remove each region of material in a total time period of less than or about 2 hours, and may be processed in less than or about 1.5 hours, less than or about 1 hour, less than or about 45 minutes, less than or about 30 minutes, less than or about 20 minutes, or less. Accordingly, the present technology may process photomasks in less time than conventional techniques, while maintaining active regions of the photomask substantially, essentially, or completely uncontacted by etchant materials.

Figure 4:
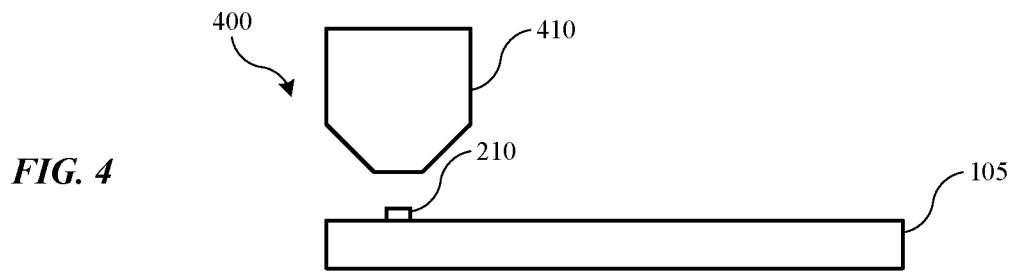
FIG. 4 shows a schematic elevational view of a heating operation according to some embodiments of the present technology.

FIG. 4 shows a schematic elevational view of a heating operation 400 according to some embodiments of the present technology. As illustrated, and previously explained, a photomask 105 may include residual coupling material 210 overlying the photomask, such as at one or more edge locations as previously discussed. As illustrated in the figure, a heating device, such as a heat lamp 410 or laser, may heat the residual coupling material to upwards of 400° C. or more, while maintaining the photomask at temperatures at least 100° C. lower, or at any of the temperatures previously noted.

Figure 5:
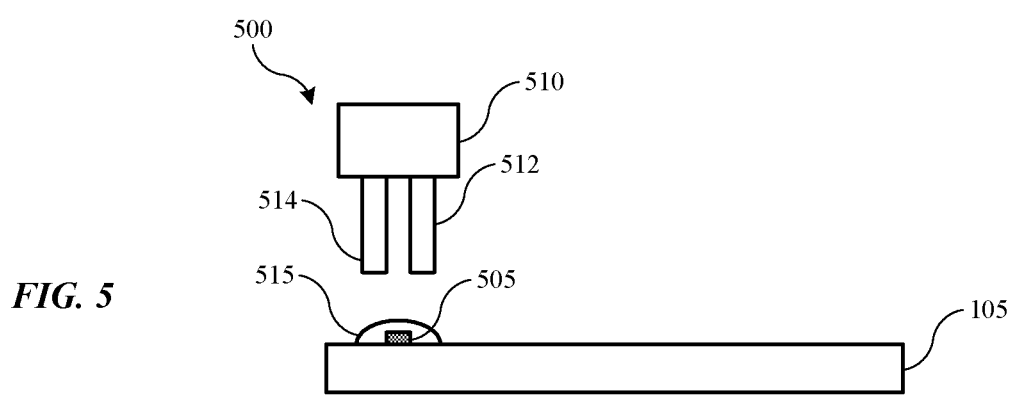
FIG. 5 shows a schematic elevational view of an etching operation according to some embodiments of the present technology.

FIG. 5 shows a schematic elevational view of an etching operation 500 according to some embodiments of the present technology. After the residual coupling material has been heated, as illustrated by heated coupling material 505, a chemical delivery system 510 may deliver one or more etchant chemicals 515 to the heated residual coupling material 505 to react with or otherwise remove the residual coupling material. Any chemical delivery system 510 may be utilized in embodiments of the present technology. In some embodiments, such as illustrated, the chemical delivery system 510 may include multiple delivery nozzles 512, 514 to separately deliver components of the etchant, such as to separately deliver sulfuric acid and hydrogen peroxide as previously explained. As illustrated, the etchant liquids may be delivered only into the edge regions of the photomask, and may not contact active regions of the photomask during the operations or removal.

Figure 6:
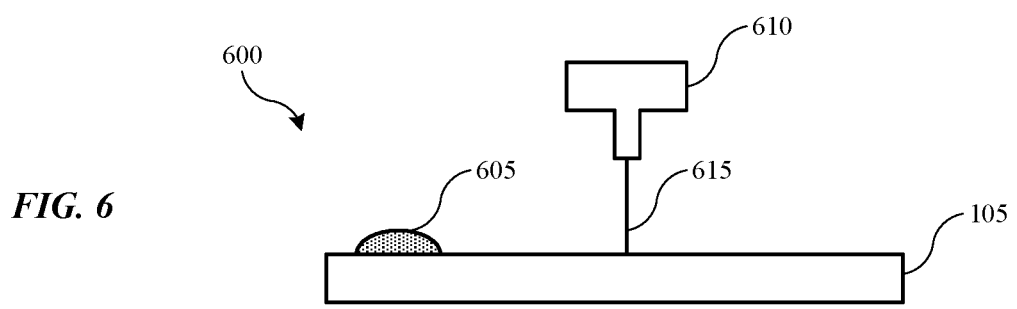
FIG. 6 shows a schematic elevational view of a rinsing operation according to some embodiments of the present technology.

FIG. 6 shows a schematic elevational view of a rinsing operation 600 according to some embodiments of the present technology. The etchant may fully dissolve and remove the residual etchant material, which may be dissolved within solution 605 as illustrated. A rinsing operation may then be performed with rinsing system 610. Rinsing system 610 may deliver a rinsing agent 615, such as deionized water to the photomask to flood the surface and remove the etchant solution 605. As illustrated, the rinsing agent may be delivered radially inward on the photomask, such as proximate a central axis or region of the photomask, and may be delivered over the active region of the photomask. The rinsing agent may then flow outward to push the solution 605 from the photomask, which may limit or prevent exposure of more central regions to the etchant, and may prevent the etchant from contacting active regions of the photomask. The flowing may be further facilitated by rotating or spinning the photomask during or subsequent delivery of the rinsing agent. In some embodiments the photomask may then be dried and then the process may be repeated at any other locations where residual coupling material may be located. These operations may then provide a photomask free of residual coupling material and maintain integrity of the photomask from exposure to the etchant material across active regions of the photomask.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the agent" includes reference to one or more agents and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of cleaning a photomask, the method comprising:
heating residual coupling material on a surface of the photomask, wherein the photomask is characterized by active regions and edge regions, wherein the residual coupling material is located on portions of the photomask overlying the edge regions, and wherein the heating raises a temperature of the residual coupling material above about 200° C., while maintaining the photomask at a temperature below about 150° C.;
applying an etchant to the residual coupling material; and
rinsing the etchant from the photomask, wherein a portion of the photomask active regions are maintained substantially free of the etchant during the method.

2. The method of cleaning a photomask of claim 1, wherein the heating comprises localized heating applied proximate the residual coupling material, and wherein the heating is contained within a region of the photomask characterized by a diameter less than 500% greater than a diameter of the residual coupling material.

3. The method of cleaning a photomask of claim 1, wherein the heating is performed for less than or about 5 minutes.

4. The method of cleaning a photomask of claim 1, wherein the etchant comprises sulfuric acid and hydrogen peroxide.

5. The method of cleaning a photomask of claim 4, wherein applying the etchant comprises sequentially applying the sulfuric acid and the hydrogen peroxide.

6. The method of cleaning a photomask of claim 5, wherein the sulfuric acid is applied prior to the hydrogen peroxide, and wherein the hydrogen peroxide is applied to the sulfuric acid after a delay of at least about 2 seconds.

7. The method of cleaning a photomask of claim 4, wherein the etchant comprises less than about 5 mL each of the sulfuric acid and the hydrogen peroxide.

8. The method of cleaning a photomask of claim 1, wherein the rinsing comprises delivering deionized water to the photomask to remove the etchant.

9. The method of cleaning a photomask of claim 8, wherein the deionized water is applied to a central location on the photomask and caused to flow laterally outward towards the etchant to limit etchant contact in active regions of the photomask.

10. The method of cleaning a photomask of claim 9, wherein the photomask is rotated during the rinsing.

11. A method of cleaning a photomask, the method comprising:
heating coupling material on a surface of the photomask, wherein the photomask is characterized by active regions and edge regions, wherein the residual coupling material is located on edge regions of the photomask, wherein the heating comprises localized heating applied proximate the residual coupling material, and wherein the heating is contained within a region of the photomask characterized by a diameter less than 500% greater than a diameter of the residual coupling material;

delivering a liquid etchant to the residual coupling material, wherein the delivery is contained within a surface area of the photomask less than about 10 cm² in which the heated residual coupling material resides;

rinsing the etchant from the photomask, wherein a portion of the active regions of the photomask are maintained substantially free of the etchant during delivery of the liquid etchant and the rinsing operations; and drying the photomask.

12. The method of cleaning a photomask of claim 11, wherein the method is performed in less than or about 20 minutes.

13. The method of cleaning a photomask of claim 11, wherein the drying is performed in a controlled environment.

14. The method of cleaning a photomask of claim 11, wherein delivering the liquid etchant comprises sequentially applying sulfuric acid and hydrogen peroxide to the heated coupling material.

15. The method of cleaning a photomask of claim 11, wherein the heating is performed by a heat lamp for a time period less than or about 2 minutes.

16. The method of cleaning a photomask of claim 11, wherein the rinsing comprises delivering a rinsing agent to the photomask radially inward of a location on the photomask on which the etchant is located.

17. The method of cleaning a photomask of claim 11, wherein the rinsing is performed less than 5 minutes subsequent delivering the liquid etchant.

18. A method of cleaning a photomask, the method comprising:

heating coupling material to a temperature above about 300° C. at a first location on a surface of the photomask, wherein the heating raises a temperature of the coupling material while maintaining the photomask at a temperature below about 150° C., wherein the photomask comprises active regions and edge regions, and wherein the residual coupling material is located at edge regions of the photomask;

delivering a two-part liquid etchant to the residual coupling material, wherein the delivery includes initially providing a volume of sulfuric acid and subsequently providing a volume of hydrogen peroxide;

rotating the photomask while applying a rinsing agent to the photomask, wherein the rinsing agent is delivered to a central location on the photomask; and drying the photomask.

19. The method of cleaning a photomask of claim 18, wherein the method is repeated at a second location on a surface of the photomask.

* * * * *